(12) United States Patent
Mathis et al.

(10) Patent No.: US 7,541,959 B1
(45) Date of Patent: Jun. 2, 2009

(54) HIGH SPEED SIGNAL PROCESSOR

(75) Inventors: Ronald F. Mathis, Murrieta, CA (US); Stephen R. Mathis, Menifee, CA (US); Paul N. Huntley, Poway, CA (US)

(73) Assignee: Photonics Products, Inc., Murrieta, CA (US)

( * ) Notice: Subject to any disclaimer, the term of this patent is extended or adjusted under 35 U.S.C. 154(b) by 27 days.

(21) Appl. No.: 11/716,532

(22) Filed: Mar. 9, 2007

Related U.S. Application Data

(63) Continuation-in-part of application No. 11/298,035, filed on Dec. 9, 2005, which is a continuation of application No. 10/820,168, filed on Apr. 7, 2004, now Pat. No. 6,980,147.

(60) Provisional application No. 60/781,473, filed on Mar. 9, 2006, provisional application No. 60/479,094, filed on Jun. 17, 2003, provisional application No. 60/460,997, filed on Apr. 7, 2003.

(51) Int. Cl.
*H03M 1/12* (2006.01)

(52) U.S. Cl. .................................. 341/155; 375/245

(58) Field of Classification Search ......... 341/125–155; 375/245, 247, 316
See application file for complete search history.

(56) References Cited

U.S. PATENT DOCUMENTS

| 1,059 | A | 12/1838 | Konig |
| H001059 | H * | 5/1992 | Konig .................... 398/202 |
| 5,963,889 | A * | 10/1999 | Irregger et al. .............. 702/124 |
| 5,963,899 | A | 10/1999 | Bayya et al. |
| 6,075,820 | A * | 6/2000 | Comino et al. .............. 341/143 |
| 6,380,879 | B2 * | 4/2002 | Kober et al. ................ 341/155 |
| 6,411,653 | B1 | 6/2002 | Arunachalam et al. |
| 6,463,450 | B1 | 10/2002 | Balachandran et al. |
| 6,492,914 | B2 | 12/2002 | Katoh |
| 6,532,256 | B2 | 3/2003 | Miller |
| 6,806,820 | B1 | 10/2004 | Dhalla et al. |
| 6,980,147 | B2 | 12/2005 | Mathis et al. |

OTHER PUBLICATIONS

"Theory and Design of *M*-Channel Maximally Decimated Quadrature Mirror Filters with Arbitrary *M*, Having the Perfect-Reconstruction Property", by P.P. Vaidyanathan,; *IEEE Transactions on Acoustics, Speech, and Signal Processing*, vol. ASSP-35, No. 4, Apr. 1987.

* cited by examiner

*Primary Examiner*—Lam T Mai
(74) *Attorney, Agent, or Firm*—Stout, Uxa, Buyan & Mullins, LLP; Donald E. Stout

(57) ABSTRACT

A waveform acquisition system that captures and digitizes a wideband electrical signal through a bank of front end filters, frequency down converters, and conventional digitizers (A/D converters). A software algorithm reconstructs the composite input signal and applies the necessary corrections to remove the effects of hardware impairments. This approach is possible because it uses a class of filters that exhibit the quality of perfect waveform reconstruction, allowing signals whose spectral components overlap multiple filter bands, to be faithfully reconstructed. A calibration generator switched into the input port serves as a reference for quantifying and removing hardware errors. The channelized analog-to-digital converter (ADC) effectively multiplies the bandwidth and sampling rate of the conventional digitizer performance in a single channel by the number of channels in the system. The use of digital local oscillators enable a compact, low power, monolithic architecture.

17 Claims, 2 Drawing Sheets

HIGH SPEED SIGNAL PROCESSOR

This application is a continuation-in-part under 35 U.S.C. 120 of pending U.S. patent application Ser. No. 11/298,035, entitled Channelized Analog-to-Digital Converter and filed on Dec. 9, 2005, which in turn is a continuation under 35 U.S.C. 120 of U.S. patent application Ser. No. 10/820,168, entitled Channelized Analog-to-Digital Converter and filed on Apr. 7, 2004, and now U.S. Pat. No. 6,980,147, which in turn claimed the benefit under 35 U.S.C. 119(e) of U.S. Provisional Patent Application Ser. No. 60/460,997, filed on Apr. 7, 2003, and U.S. Provisional Patent Application Ser. No. 60/479,094, filed on Jun. 17, 2003.

Additionally, this application claims the benefit under 35 U.S.C. 119(e) of the filing date of U.S. Provisional Patent Application Ser. No. 60/781,473, entitled Channelized Analog-to-Digital Converter and filed on Mar. 9, 2006.

All of the above referenced applications are herein expressly incorporated by reference.

BACKGROUND OF THE INVENTION

The present invention pertains to the conversion of analog signals to digital format. It is particularly applicable for capturing wideband signals where the desired dynamic range of the system cannot be achieved by existing analog to digital converters. There are many applications where the system is limited by the dynamic range of the digitizer. Some of the applications with this limitation include high frequency test equipment, wide band communications, and CDMA cell towers.

The conversion speed and dynamic range of conventional digitizers is limited by several factors. An article authored by R. H. Walden, and entitled *Analog-to-Digital Converter Survey and Analysis*, published in IEEE Communications, Vol. 17, No. 4, pp. 539-550, April 1999, aptly describes these factors and shows that as the sampling rate increases, the dynamic range degrades. In particular, the dynamic range decreases by one effective bit (6.02 dB) for each octave increase in instantaneous bandwidth. There has been significant effort put toward finding a solution around this digitizer limitation. Most of the solutions involve time interleaving multiple digitizers together so that they each sample one after the other. This allows for a sampling rate beyond the performance of only one digitizer, but it does not get around the problem caused by the time aperture window of each sample. According to the aforementioned article, this time aperture window, known as jitter, is the primary limitation to the dynamic range of a digitizer.

One way to get around the jitter limitation is to filter the signal into frequency slices or channels and then mix the frequency channels down to baseband. This type of channelized design can get around the jitter limitation because each digitizer is sampling a much narrower band signal at a lower frequency. The channelized system is dependent on the stability of the local oscillators for the mixers rather than the digitizer. The stability of a frequency oscillator can be much greater than the jitter of a digitizer, so combining the channels is, in effect, multiplying the performance of the digitizers used to sample the channels.

Channelized systems have been attempted for many years, but have not been successful for several reasons. First and foremost is the difficulty of coherently recombining the channels together. Most RF filters cause significant distortion to the signal information at the band edges. Coherently combining the band edges of adjacent filters has proved to be an impossible task prior to this invention. The second difficulty involves aligning the channels in time and knowing the phase of each local oscillator during the signal acquisition. The final difficulty is removing the amplitude and phase distortions that are introduced by the RF and electronic elements in the system. These three difficulties combined have made the realization of a channelized system impossible prior to this invention.

SUMMARY OF THE INVENTION

The present invention addresses the limitations described above in channelizing the signal, frequency down-converting to allow each band to be sampled at a lower rate, digitizing, and then reconstructing the signal. In particular, the present invention addresses the difficulty of aligning the channels in time and provides a means for knowing the phase of each local oscillator during signal acquisition. Although the technique of channelizing is not new, the present invention describes a method of implementing this technique so that captured information in overlapping multiple channels can be recombined to faithfully reconstruct the input signal. The key to the present invention is the use of a specially designed set of M-band filters that have a perfect reconstruction property. (Perfect reconstruction means that the sum of the cascaded responses of the M-band analysis filters followed by the synthesis filters produces an overall flat amplitude response and group delay.) One disclosed embodiment employs a set of four M-band filters. The output of each filter is mixed down to a lower frequency. Once converted to a lower frequency, the digitizer, operating at a proportionally lower sample rate, provides an improved dynamic range. The signals are equalized and reconstructed with a set of M-band synthesis filters in software. The dynamic range of the low frequency digitizers is maintained after the channels are recombined due to the summation of both signal and noise power from each channel.

The M-band filter theory provides a theoretical basis for coherently recombining the channels, but for this theory to be realized, the channels have to be aligned in time and phase, and the phase of the mixer LO at the time of the capture must be known. The channel alignment may be achieved through the use of a calibration signal that is injected into the input port. In one embodiment this signal is injected at the end of each capture event. In another embodiment, a continuous calibration signal is used. The preferred embodiment uses a two step process in which the entire signal is first mixed down with a single common RF local oscillator. The signal is then split into the M channels and the individual channels are mixed down with digital local oscillators that can be set to a known Phase State. This eliminates the need for real time local oscillator phase tracking. With this method, the LO phase and the timing errors between channels can be determined at the exact time at which the signal was captured without the presence of a timing signal.

The sequence of operation begins with an electrical input signal that is received and filtered into a plurality of bands. The bands are converted to a lower frequency range through a set of down converters and digitized by a bank of conventional digitizers. After applying the appropriate corrections to the captured data, a software algorithm mathematically converts each band back to its original frequency. Finally, each band is passed through a digital synthesis filter and summed to form the reconstructed waveform. An optional detector can be used to trigger the waveform capturing sequence.

More particularly, there is provided a high-speed signal processor which functions as a waveform acquisition system and a high-speed analog-to-digital converter. The processor comprises a filter system for dividing an input signal into a series of adjacent frequency bands, as well as a digitizer for digitizing each frequency band output from the filter system, and a system for reconstructing the original input signal. In preferred approaches, the processor further comprises a frequency down converter for down converting one or more of the adjacent frequency bands. In alternative embodiments, the frequency down converter may comprise either a single direct processing stage for each channel, wherein the single stage direction conversion process for each channel is performed using a digital local oscillator, or the frequency down converter may comprise two or more processing stages.

In the frequency converter, the entire signal is first mixed down to an IF frequency with a single common local oscillator and then divided into a plurality of bands, each of which is then mixed to baseband using a digital local oscillator.

The filter system utilized in the present invention preferably comprises an M-band filter bank. The M-band filters in the M-band filter bank enable perfect reconstruction, meaning that the cascaded response of the M-band analysis filters followed by the synthesis filters produces an overall flat amplitude response and group delay across all frequencies, with mirror image roll-off at filter boundaries and with the amplitude at the filter boundaries nominally about 6.02 dB below the constant peak values. The M-band filters in the M-band filter bank may be implemented optically using fiber optics, or alternative may be implemented electronically or using software.

In the preferred system, each channel output is equalized, to thereby shape the transfer function of the channel into that of an M-band filter. The channel equalization is implemented with Weiner filter technology.

A calibration signal may be continuously injected into the processor to serve as a reference for quantifying and removing hardware errors. Alternatively, a pulsed calibration signal may be injected into the processor during each signal capture sequence.

In a preferred embodiment, the capability to set oscillators to a known state is added to the processor to serve as a reference for quantifying and removing hardware errors. Preferably, the digital local oscillator functions to enable a capability to set the processor to a known state for serving as a reference for quantifying and removing hardware errors.

In another aspect of the invention, there is disclosed a method for processing signals, which comprises a step of dividing an input signal into a series of adjacent frequency bands, a step of digitizing each frequency band, and a further step of reconstructing the original input signal. In a preferred embodiment, the method additionally comprises a step of down converting one or more of the adjacent frequency bands, using a digital local oscillator.

The invention, together with additional features and advantages thereof, may best be understood by reference to the following detailed description taken in conjunction with the accompanying illustrative drawings.

DETAILED DESCRIPTION OF THE INVENTION

Figure 1:
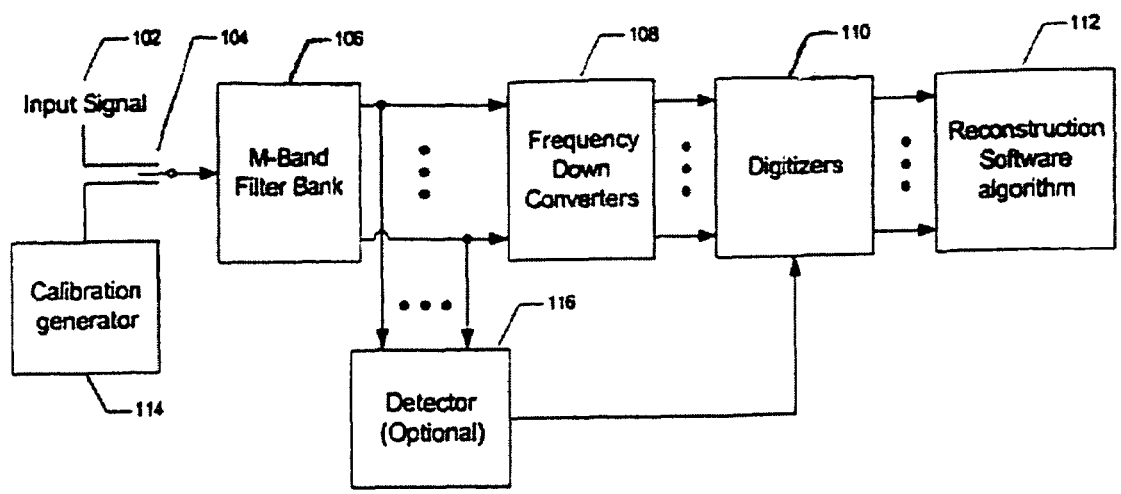
FIG. 1 is a functional block diagram of the essential portions of one embodiment of a channelized analog-to-digital converter (ADC) constructed in accordance with the principles of the present invention.

Referring first to FIG. 1, a functional block diagram illustrates one embodiment of the high speed, channelized, analog-to-digital converter of the present invention. The converter includes an input signal 102, a switch 104, an M-band filter bank 106, frequency down converters 108, a set of conventional digitizers 110, and reconstruction software algorithms 112. During each capture sequence, a calibration generator 114 is switched into the input to provide a reference for quantifying and removing hardware errors. An optional detector 116 may be connected either at the input or the output of the M-band filter bank 106 in order to trigger the waveform capturing sequence.

The M-band perfect reconstruction technique requires two sets of filters, namely an analysis filter set and a synthesis filter set. The analysis filter set consists of M filters that divide the frequency range into M sub-bands. The synthesis filter set consists of filters that map to each of the filters in the analysis filter set. Both filter sets are FIR type filters and have a repeating nature so that M may be larger than the physical number of analysis filters. An alternative embodiment co-locates or combines these filters into the equivalent of a single filter located after the digitizer. The perfect reconstruction algorithm specifies the filter coefficients such that the cascade of these filter sets gives an ideally constant amplitude and group delay across all frequencies, with mirror image roll-off at filter boundaries and with the amplitude at the filter boundaries nominally about 6.02 dB below the constant peak values. The analysis filters may be implemented optically by summing an array of weighted fiber optic delay lines, or they can be implemented in software by shaping (equalizing) the amplitude and phase response of filtered or unfiltered channels into the ideal analysis filter response. In the case of filtered or unfiltered channels, an anti aliasing filter in front of the digitizer will serve as a pre filter. The synthesis filter is implemented in software using conventional signal processing techniques.

Figure 2:
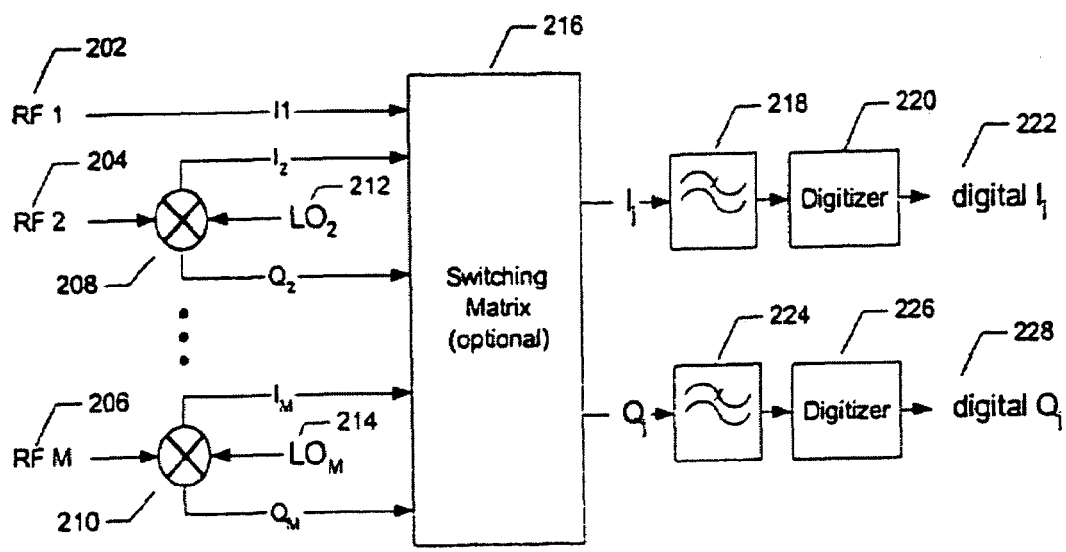
FIG. 2 is a block diagram of one embodiment of a down converter and digitizer means.

Following the M-band filter bank 106 is a set of frequency down converters 108 whose purpose is to translate each band of the channelizer to a lower frequency range that can be digitized by conventional digitizers. FIG. 2 illustrates one embodiment of this process. The M channel inputs 202, 204, and 206 are applied to quadrature down converters 208 and 210, that are driven by local oscillators (LOs) 212 and 214, and applied to a switching matrix 216. Channel 1 typically does not require a down converter if it is already at base band. The frequencies of the LOs are preferably chosen to be at the center of each filter band. Other frequencies are possible such as between adjacent filters. The in-phase (I) and quadrature (Q) output signals of the quadrature down converters contain all information necessary to reproduce the input signal without ambiguity. The optional switching matrix may be used to serially sequence through each channel thereby reducing the number of digitizers. Without this switching matrix, a dedicated digitizer is required for each channel. The output of the switching matrix is applied to low pass anti-alias filters 218 and 224, and then to conventional digitizers 220 and 226. The digital representation of these signals 222 and 228 appears at the output of the digitizers for subsequent processing.

Figure 3:
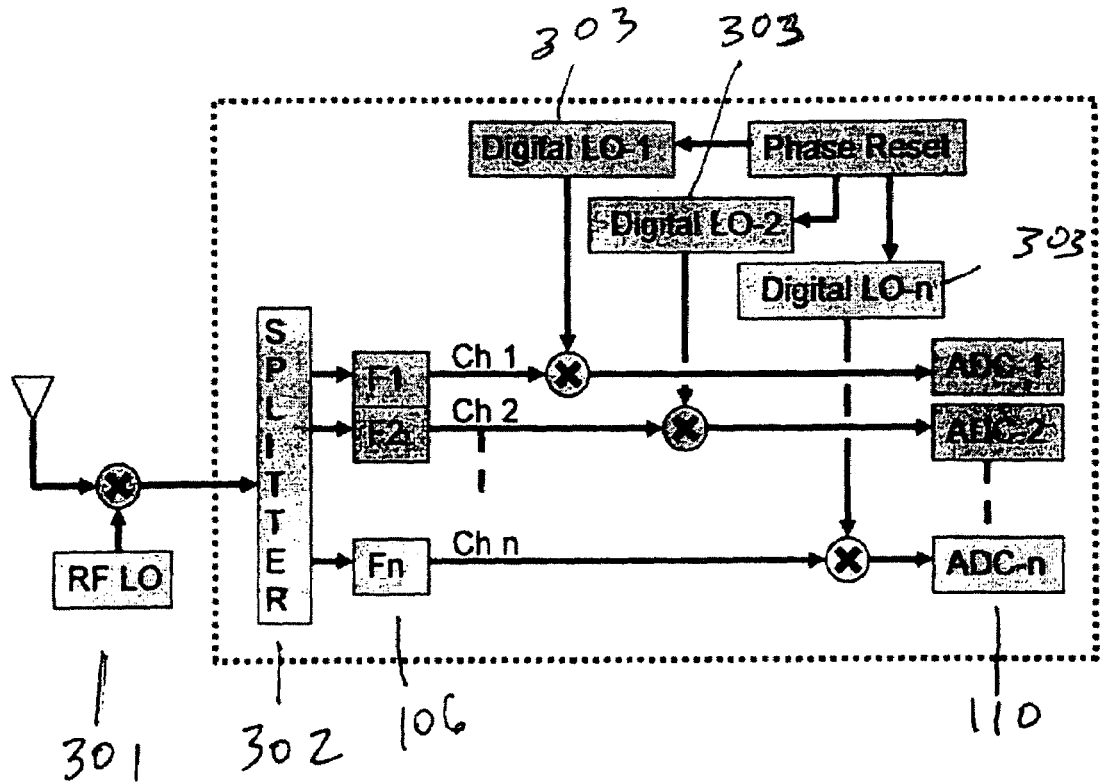
FIG. 3 is an illustration of a presently preferred embodiment of the down converter and digitizer array disclosed in the present invention.

FIG. 3 illustrates a presently preferred down conversion system. The system mixes the entire signal down from RF to IF with a single common RF local oscillator 301. The IF signal is then split into M channels with a splitter 302, filtered in filter array 106, and the individual channels are mixed down to baseband with digital local oscillators 303 that can be set to a known phase state. The baseband signals are then digitized with an array of digitizers 110. This embodiment eliminates the need for real time LO phase tracking, and the functions inside the dotted line in FIG. 3 can be combined on a single monolithic circuit, thereby significantly reducing size, power consumption, and weight as compared with other embodiments.

Figure 4:
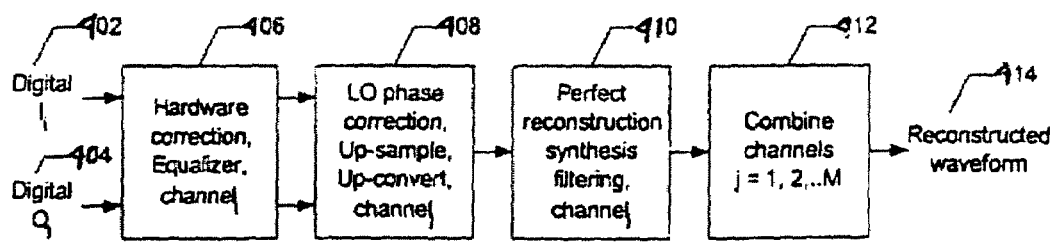
FIG. 4 is a diagram of the software correction and reconstruction algorithm of the present invention.

The final techniques essential for implementing the Channelized ADC are the software correction and reconstruction algorithms illustrated in FIG. 4. The first software algorithm 406 corrects for the effects of hardware impairments on the digital I and Q signals 402 and 404 corresponding to one of the channels. This algorithm takes a measurement of the existing transfer function of each channel, and uses it to create a shaping filter so that the combined response of the transfer function of the channel plus the shaping filter looks like a perfect M-band filter for that channel. This preferred software implementation of the M-band filter eliminates the need for a hardware implementation as shown in FIG. 1, block 106. The preferred embodiment uses a Weiner filter that has an additional property of suppressing noise. Software algorithm 406 also removes imbalances and DC offsets in the quadrature down converter when this down conversion means is employed.

The second software algorithm 408 measures and corrects for the uncertainty of the LO phase in the down converter, and the time delay differences between channels. It extracts this information from a calibration signal that has been injected preferably immediately after the received signal. In alternative embodiments the calibration signal is injected during or after the received signal. In yet another embodiment a continuous calibration signal is injected continuously keeping the system in alignment. The information extraction can be done using various methods including correlation techniques and waveform analysis. Software algorithm 408 also up-samples the data and up-converts each channel to its original frequency. At this point the signal becomes a real time sequence, rather than a complex signal, and is applied to the next block 410 for synthesis filtering according to the perfect reconstruction algorithm. Once this process is completed for each channel, the data are summed via summer 412, and appear at the output as the reconstructed waveform 414.

While the invention herein disclosed has been described by means of specific embodiments and applications thereof, numerous modifications and variations could be made thereto by those skilled in the art without departing from the scope of the invention set forth in the claims.

What is claimed is:

1. A high-speed signal processor which functions as a waveform acquisition system and a high-speed analog-to-digital converter, said processor comprising:
a filter system, comprising an M-band filter bank, for dividing an input signal into a series of adjacent frequency bands;
a frequency down converter for down converting one or more of the adjacent frequency bands, said frequency down converter comprising a single direct processing stage for each channel;
a digitizer for digitizing each frequency band output from said frequency down converter; and
a system for reconstructing the original input signal;
wherein the single stage direction conversion process for each channel is performed using a digital local oscillator and wherein the M-band filters in said M-band filter bank enable perfect reconstruction, meaning that the cascaded response of the M-band analysis filters followed by the synthesis filters produces an overall flat amplitude response and group delay across all frequencies, with mirror image roll-off at filter boundaries and with the amplitude at the filter boundaries nominally about 6.02 dB below the constant peak values.

2. The high-speed signal processor as recited in claim 1, wherein said digital local oscillator functions to enable a capability to set the processor to a known state for serving as a reference for quantifying and removing hardware errors.

3. A method for processing signals, comprising:
dividing an input signal into a series of adjacent frequency bands using an M-band filter bank;
digitizing each frequency band;
down converting one or more of the adjacent frequency bands, the down converting step including steps of first mixing down the entire signal to an IF frequency with a single common local oscillator and then dividing the signal into a plurality of bands, each of which is then mixed to baseband using a digital local oscillator; and
reconstructing the original input signal.

4. A high-speed signal processor which functions as a waveform acquisition system and a high-speed analog-to-digital converter, said processor comprising:
a filter system, comprising an M-band filter bank, for dividing an input signal into a series of adjacent frequency bands;
a frequency down converter for down converting one or more of the adjacent frequency bands, said frequency down converter comprising two or more processing stages;
a digitizer for digitizing each frequency band output from said frequency down converter; and
a system for reconstructing the original input signal;
wherein the M-band filters in said M-band filter bank enable perfect reconstruction, meaning that the cascaded response of the M-band analysis filters followed by the synthesis filters produces an overall flat amplitude response and group delay across all frequencies, with mirror image roll-off at filter boundaries and with the amplitude at the filter boundaries nominally about 6.02 dB below the constant peak values.

5. A high-speed signal processor which functions as a waveform acquisition system and a high-speed analog-to-digital converter, said processor comprising:
a filter system for dividing an input signal into a series of adjacent frequency bands;
a frequency down converter for down converting one or more of the adjacent frequency bands;
a digitizer for digitizing each frequency band output from said frequency down converter; and
a system for reconstructing the original input signal;
wherein in said frequency converter the entire signal is first mixed down to an IF frequency with a single common local oscillator and then divided into a plurality of bands, each of which is then mixed to baseband using a digital local oscillator.

6. The high-speed signal processor as recited in claim 5, wherein said filter system comprises an M-band filter bank.

7. The high-speed signal processor as recited in claim 6, wherein the M-band filters in said M-band filter bank enable perfect reconstruction, meaning that the cascaded response of the M-band analysis filters followed by the synthesis filters produces an overall flat amplitude response and group delay across all frequencies, with mirror image roll-off at filter boundaries and with the amplitude at the filter boundaries nominally about 6.02 dB below the constant peak values.

8. The high-speed signal processor as recited in claim 6, wherein the M-band filters in said M-band filter bank are implemented optically using fiber optics.

9. The high-speed signal processor as recited in claim 6, wherein the M-band filters in said M-band filter bank are implemented electronically.

10. The high-speed signal processor as recited in claim 6, wherein the M-band filters in said M-band filter bank are implemented using software.

11. The high-speed signal processor as recited in claim 6, wherein each channel output is equalized, to thereby shape the transfer function of the channel into that of an M-band filter.

12. The high-speed signal processor as recited in claim 11, wherein the channel equalization is implemented with Weiner filter technology.

13. The high-speed signal processor as recited in claim 5, and further comprising a calibration signal which is continuously injected into said processor to serve as a reference for quantifying and removing hardware errors.

14. The high-speed signal processor as recited in claim 5, wherein said digital local oscillator functions to enable a capability to set the processor to a known state for serving as a reference for quantifying and removing hardware errors.

15. The high-speed signal processor as recited in claim 5, and further comprising a pulsed calibration signal which is injected into said processor in pulses to serve as a reference for quantifying and removing hardware errors.

16. The high-speed signal processor as recited in claim 5, wherein said processor includes a capability to set the oscillators to a known state to serve as a reference for quantifying and removing hardware errors.

17. A high-speed signal processor which functions as a waveform acquisition system and a high-speed analog-to-digital converter, said processor comprising:

a filter system, comprising an M-band filter bank, for dividing an input signal into a series of adjacent frequency bands;

a digitizer for digitizing each frequency band output from said filter system; and a system for reconstructing the original input signal;

wherein the M-band filters in said M-band filter bank enable perfect reconstruction, meaning that the cascaded response of the M-band analysis filters followed by the synthesis filters produces an overall flat amplitude response and group delay across all frequencies, with mirror image roll-off at filter boundaries and with the amplitude at the filter boundaries nominally about 6.02 dB below the constant peak values.

* * * * *